United States Patent
Scholder

[19]

[11] Patent Number: 5,936,836
[45] Date of Patent: Aug. 10, 1999

[54] COMPUTER WITH AN IMPROVED INTERNAL COOLING SYSTEM

[75] Inventor: Erica Scholder, Austin, Tex.

[73] Assignee: Dell U.S.A., L.P., Round Rock, Tex.

[21] Appl. No.: 08/994,742

[22] Filed: Dec. 19, 1997

[51] Int. Cl.⁶ .................................................. H05K 7/20
[52] U.S. Cl. .......................... 361/695; 361/690; 361/694; 361/704; 361/719; 361/715; 257/721; 257/722; 257/727; 165/80.2; 165/80.3; 165/104.34
[58] Field of Search .................................... 361/694, 695, 361/697, 704, 707, 689, 690, 714, 717, 718, 719; 257/717, 718, 719, 721, 727; 165/80.2, 80.3, 185, 104.33

[56] References Cited

U.S. PATENT DOCUMENTS

| | | |
|---|---|---|
| 4,710,852 | 12/1987 | Keen . |
| 5,331,507 | 7/1994 | Kyung et al. . |
| 5,452,181 | 9/1995 | Hoover .................................... 361/697 |
| 5,504,650 | 4/1996 | Katsui et al. ............................ 361/697 |
| 5,526,874 | 6/1996 | White . |
| 5,535,094 | 7/1996 | Nelson et al. ........................... 361/697 |
| 5,592,363 | 1/1997 | Atarashi et al. ......................... 361/689 |
| 5,625,227 | 4/1997 | Estes et al. . |
| 5,630,469 | 5/1997 | Butterbaugh et al. .................. 165/80.3 |
| 5,640,046 | 6/1997 | Suzuki et al. ............................ 257/714 |
| 5,673,176 | 9/1997 | Penniman et al. . |

OTHER PUBLICATIONS

U.S. Application No. 08/763,238, filed Dec. 12, 1996, Computer System With Heat Sink Having an Integrated Grounding Tab, Ralph Remsburg et al., Abstract and 3 sheets of drawings.

U.S. Application No. 08/959,185, filed Oct. 28, 1997, Heat Sink Fastener Retention Apparatus and Method for Computer Systems, John Jeffries et al., Abstract and 7 sheets of drawings.

U.S. Application No. 08/976,164, filed Nov. 21, 1997, Computer Processor Module Ground/EMI–Shield Spring Clip and Method, Rick Wahl et al., Abstract and 11 sheets of drawings.

*Primary Examiner*—Leo P. Picard
*Assistant Examiner*—Boris L. Chervinsky
*Attorney, Agent, or Firm*—Haynes and Boone, L.L.P.

[57] ABSTRACT

A computer in which a microprocessor module is disposed in the computer chassis and is cooled by a heat sink disposed in a heat exchange relation to the microprocessor. A fan is disposed in the chassis and adapted to induce air flow, and a shroud is connected to the heat sink and encloses the heat sink for directing the air through the heat sink for removing heat from the heat sink.

21 Claims, 3 Drawing Sheets

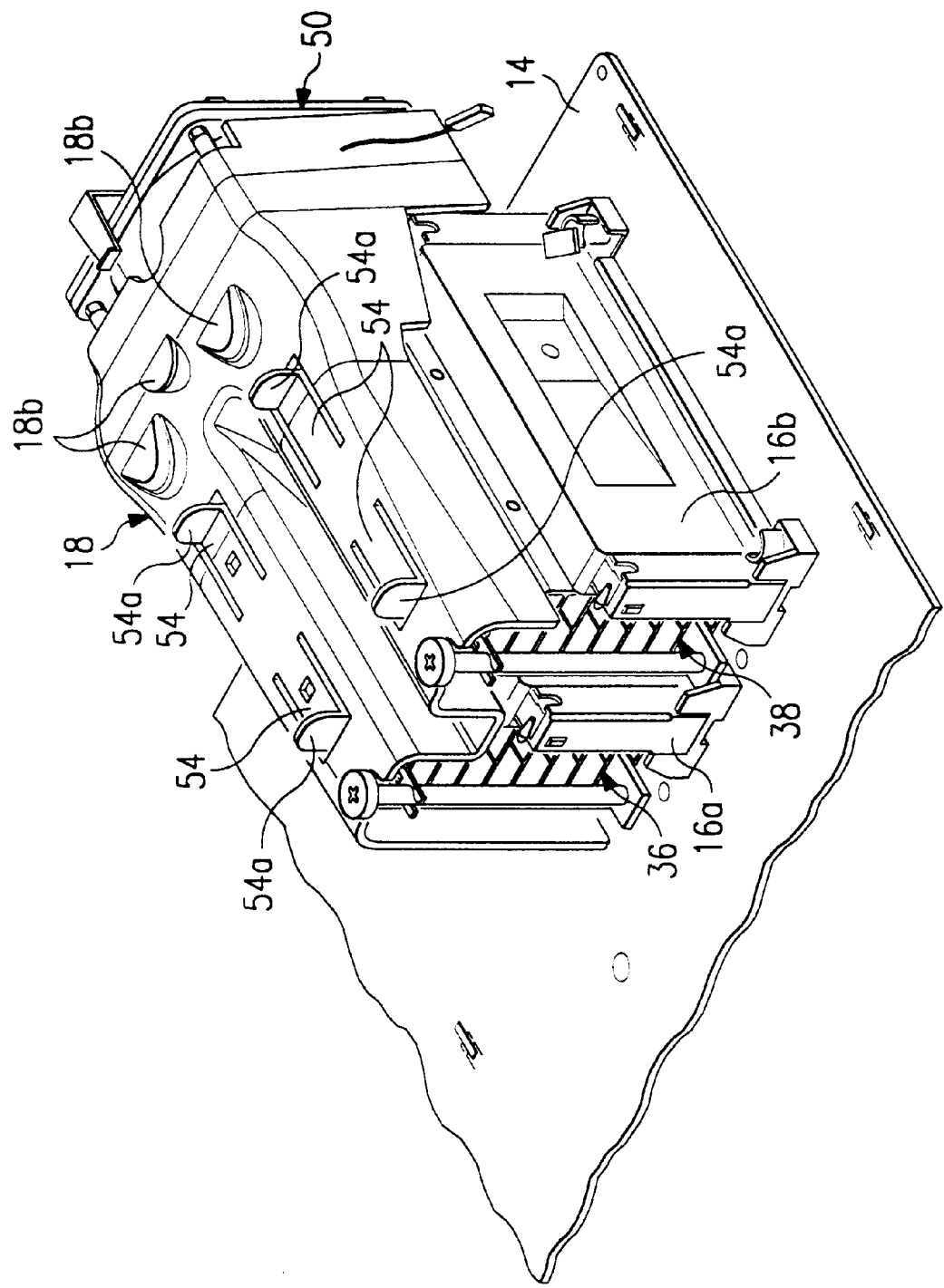

COMPUTER WITH AN IMPROVED INTERNAL COOLING SYSTEM

TECHNICAL FIELD

The invention relates generally to the field of computers, and, more particularly, to a computer having an internal cooling system for cooling one or more microprocessors disposed in the computer chassis.

BACKGROUND

A great majority of computers on the market include one or more microprocessors that are mounted in the computer chassis. The microprocessors are designed to operate at relatively high operating speeds and, as the technology evolves, these speeds increase. However, these increases in operating speeds also increases the amount of heat that is generated to the extent that the heat must be removed from the microprocessors to keep their operating temperatures within acceptable limits.

This heat removal presents a continually increasing problem for manufacturers. Traditionally, a combination of air venting through holes in the enclosure, heat sinks, and fans have been used to remove the heat. When heat sinks are used, air must be forced across the heat sink by using a fan, especially in connection with computers using microprocessor modules operating at relatively high speeds. Since fans produce noise when they are in operation, most manufacturers set limits on the total allowable noise as part of their computers' operating specifications.

In addition to their contribution to total system noise, fans also add to the cost of the system, add additional complexity in assembly, and take up valuable space inside the enclosure. Therefore maximizing the efficiency of the heat removal scheme can result in a number of advantages. To this end, a plastic duct has been developed to force the air through the heat sinks where it would most efficiently remove the heat from the microprocessors. By increasing the efficiency of the cooling system in this manner, the fan can run at a slower speed, and generates less noise. However, to install and remove this type of duct is difficult since it requires skilled labor and special tools. Also the duct, when installed, is often not adequately secured in the computer chassis, and thus easily becomes loose.

Therefore, what is needed is a cooling assembly for a computer that can be installed and removed easily without any tools, yet is secure in its installed position.

SUMMARY

Accordingly, an embodiment of the present invention is directed to a computer in which a microprocessor module is disposed in the computer chassis and is cooled by a heat sink disposed in a heat exchange relation to the microprocessor. A fan is disposed in the chassis and adapted to induce air flow, and a shroud is connected to the heat sink and encloses the heat sink for directing the air through the heat sink for removing heat from the heat sink.

This gives rise to several advantages. For example, the operation of the cooling fan is maximized and its efficiency increased. Also, the shroud can be installed and removed easily without any tools, yet is secure in its installed position.

BRIEF DESCRIPTION OF THE DRAWINGS

FIG. 3 is a view similar to FIG. 2 but depicting the components of FIG. 2 in a assembled condition.

DETAILED DESCRIPTION OF THE PREFERRED EMBODIMENT

Figure 1:
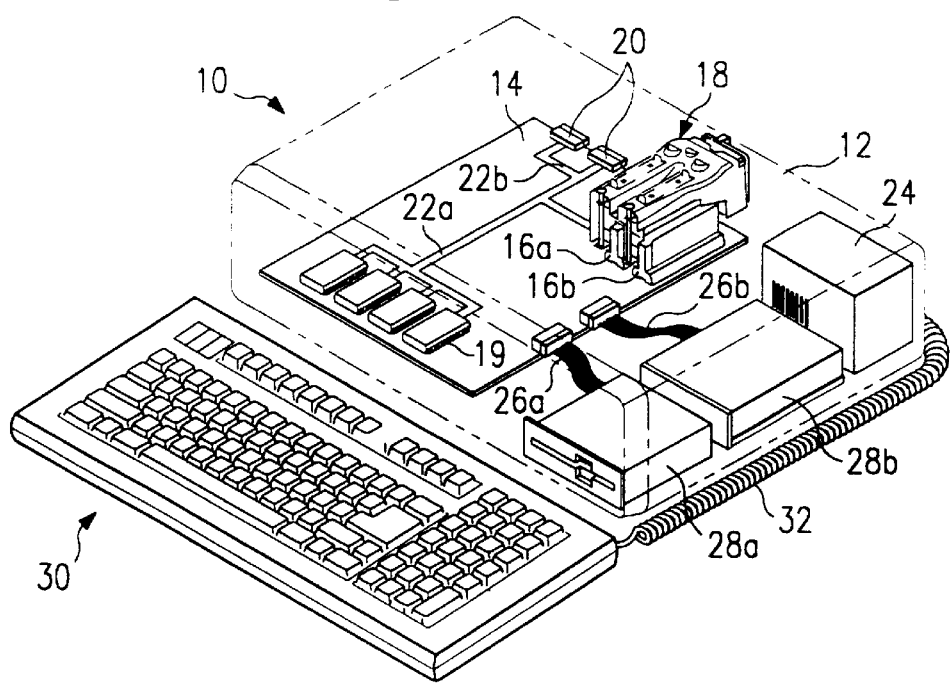
FIG. 1 is a schematic/isometric view of an embodiment of the computer according to an embodiment of the present invention.

FIG. 1 of the drawings depicts the computing system of the present invention which includes a computer 10 which, for the purposes of example, is in the form of a desktop computer. The computer 10 includes a chassis 12 (shown in phantom lines) in which a motherboard, in the form of a printed circuit board, 14 is mounted. Two microprocessor modules 16a and 16b are mounted to the motherboard 14, and a shroud 18, in the form of an enclosure, extends adjacent one microprocessor module and over the other, for reasons to be described. Four memory modules 19, and two input/output (I/O) devices 20 are mounted on the circuit board 14 in a conventional manner. Two buses 22a and 22b are also provided on the circuit board 14 that connect the microprocessors 16a and 16b to the memory modules 19 and to the input/output devices 20, respectively. A power supply 24 is connected to the circuit board 14 and a pair of cable assemblies 26a and 26b connect the circuit board 14 to a disk drive unit 28a and a hard drive unit 28b, respectively. A keyboard 30 is connected to one of the input/output devices 20 by a cable 32. It is understood that other components, electrical traces, electrical circuits and related devices (not shown) are provided in the chassis 10.

Figure 2:
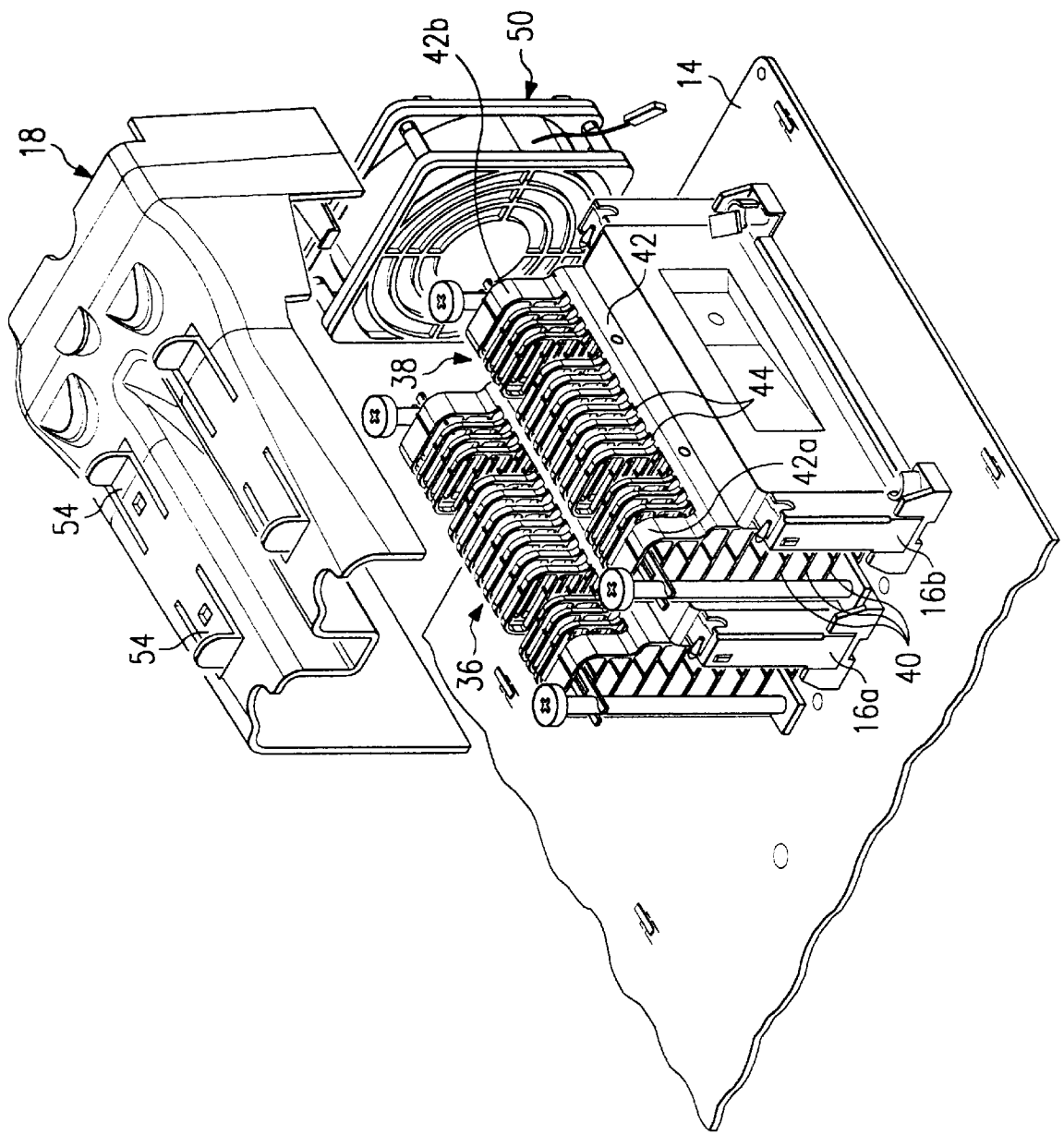
FIG. 2 is an enlarged, exploded, isometric view of the several components of the embodiment of FIG. 1.

FIG. 2 better depicts the microprocessor modules 16a and 16b along with the shroud 18 and some associated components not shown in FIG. 1. More particularly, the microprocessor modules 16a and 16b are mounted in a spaced upright position on the motherboard 14 in any known manner. A heat sink 36 extends immediately adjacent the microprocessor module 16a, and a heat sink 38 extends between the latter module and the microprocessor module 16b. The heat sinks 36 and 38 are mounted to the processor modules 16a and 16b in any know manner and, since the heat sinks do not, per se, form any part of the invention, they will only be described generally as follows.

The heat sink 38 is formed by a first set of spaced, horizontally-extended plates 40 extending between two spaced walls of a housing 42. A series of spaced, vertically-extending plates 44 are mounted to the housing 42 and extend above the plates 40. Each plate 44 is substantially U-shaped with two horizontal partitions between the legs of the U. The housing 42 does not extend over the plates 44, but has two U-shaped end portions 42a and 42b that are connected to, and extend between, its vertical walls, with the plates 44 extending between these end portions. The spacing between the plates 42, and between the partitions of the plates 44, is sufficient to permit substantial air flow between the plates and between the partitions, as will be described. Since the heat sink 36 is identical to the heat sink 38, it will not be further described.

A fan assembly 50 is disposed adjacent the respective ends of the microprocessor modules 16a and 16b and the heat sinks 36 and 38, and is preferably mounted to the rear wall of the chassis 12 in any known manner. An opening (not shown) is formed through the latter wall for exhausting air from the fan assembly 50. The fan assembly 50 is of a conventional design and, as such, is designed to pull air through the heat sinks 36 and 38 and across the microprocessor modules 16a and 16b before the air is exhausted through the above wall opening.

As shown in FIG. 3, the shroud 18 extends over the heat sinks 36 and 38 and a portion of the fan assembly 50 as shown in FIG. 3. As shown, the shroud 18 is contoured so as to accommodate the vertical plates 44 of the heat sink 38 and the corresponding vertical plates of the heat sink 36, with the upper surface of the shroud extending slightly above the upper surfaces of the plates. Four tabs 54 are formed on the upper surface of the shroud 18 and each tab is formed by cutting three slots in the upper surface. Each tab has a lip 54a extending perpendicular to the tab and outwardly from the upper surface of the shroud. As better shown in FIG. 4 in connection with two of the tabs 54, a hook 54b extends from the lower surface of each tab 54 and, in the assembled position of the shroud 18, extends under, and engages, the lower surface of the base portion of a corresponding plate 44 of the heat sink 38. The hook 54b of each tab 54 can be released by manually engaging the lip 54a of the tab 54 and pulling it upwardly as viewed in FIG. 4, so as to bend, or flex, the tab and permit the hook to move out of engagement with the latter lower surface.

Figure 4:
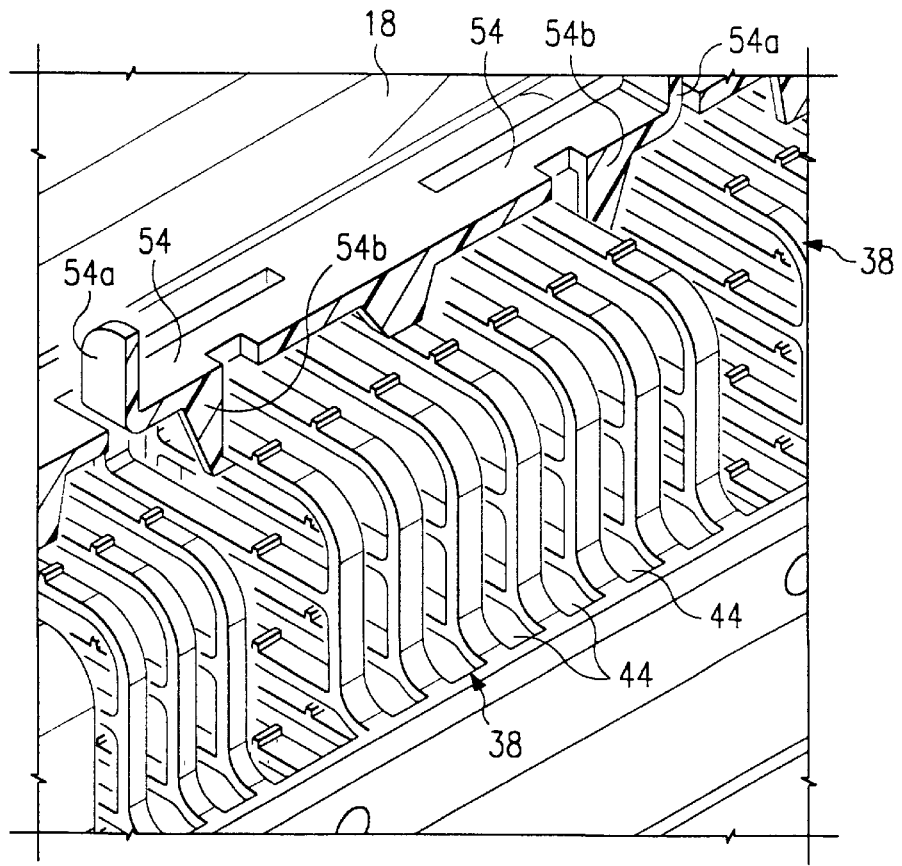
FIG. 4 is an enlarged, partial view of a portion of two components shown in FIG. 3.

The shroud 18 is attached to the heat sinks 36 and 38 in the same manner described above, i.e., by pulling the tabs 54 so that they flex upwardly, placing the shroud over the heat sinks in proper alignment and releasing the tabs so that the hooks 54b of the tabs engage the plates 44 of the heat sinks in the manner described above and shown in FIG. 4. Although only two tabs 54 of the shroud are shown in FIG. 4, it is understood that the other two are identical to the two shown in FIG. 4, and that the other two respectively engage two plates 44 of the heat sink 36.

In operation, the shroud 18 is placed over, and aligned with, the microprocessor modules 16a and 16b, the heat sinks 36 and 38 and the fan assembly 50. The shroud is then attached to the heat sinks 36 and 38 by attaching the hooks 54b of the shroud to corresponding plates 44 of the heat sinks, as described above. The fan assembly 50 induces air flow and the shroud 18 directs the air through the heat sinks 36 and 38 and across the microprocessor modules 16a and 16b before the air is exhausted through the rear wall of the chassis 12.

Several advantages result from the foregoing. For example, the shroud 18 directs the cooling air in a path in which it is used most efficiently to cool the heat sinks 36 and 38 as well as the microprocessor modules 16a and 16b to insure that their respective operating temperatures, as well as the temperature within the chassis 12, will not exceed any design limits. Thus the operation of the fan assembly 50 is maximized and its efficiency increased. Also, the shroud 18 can be installed and removed easily without any tools, yet is secure in its installed position.

It is understood that variations may be made in the foregoing without departing from the scope of the invention. For example, the embodiment described above is not limited to use with a desktop computer but is equally applicable to all other types of computers such as laptop computers, tower computers, etc. Also, any number of microprocessor modules, heat sinks and shrouds can be mounted and used within the scope of the present invention. Still other variations in the present invention are contemplated and in some instances, some features of the invention can be employed without a corresponding use of other features. Accordingly, it is appropriate that the appended claims be construed broadly in a manner consistent with the scope of the invention.

What is claimed is:

1. A computer comprising;
   a chassis,
   a microprocessor module disposed in the chassis,
   a heat sink disposed in the chassis in a heat exchange relation to the microprocessor, the heat sink formed by spaced, horizontally-extending plates and substantially U-shaped, vertically-extending plates extending above the horizontally-extending plates,
   a fan disposed in the chassis and adapted to induce air flow, and
   a shroud connected to the heat sink, and enclosing the heat sink for directing the air through the heat sink for removing heat from the heat sink, wherein the shroud is contoured to accommodate the vertically-extending plates and to provide a gap along the contour of the vertically-extending plates.

2. The computer of claim 1 wherein the shroud is quick-detachably connected to the heat sink.

3. The computer of claim 1 wherein the shroud comprises an enclosure and at least one tab formed on the enclosure for engaging the vertically-extending plates of the heat sink to connect the shroud to the heat sink.

4. The computer of claim 3 wherein the shroud further comprises a hook extending from the tab and adapted to engage the vertically-extending plates of the heat sink to connect the shroud to the heat sink.

5. The computer of claim 3 wherein the tab is resiliently coupled to the enclosure to enable the tab to be engaged with, and removed from, the vertically-extending plates of the heat sink.

6. The computer of claim 4 wherein the shroud further comprises a lip extending from the tab to enable the tab to be manually flexed relative to the enclosure, thus disengaging the hook from the plates.

7. The computer of claim 1 wherein the shroud includes a member for directing air across the microprocessor.

8. The computer of claim 1 further comprising an additional microprocessor module disposed in the chassis, and an additional heat sink disposed in the chassis in a heat exchange relation to the additional microprocessor, wherein the shroud is also connected to the additional heat sink, encloses the additional heat sink, and directs the air through the additional heat sink for removing heat from the additional heat sink.

9. A method for cooling a computer comprising the steps of:
   providing a heat sink having structurally integrated vertical horizontal plates, the heat sink in a heat exchange relation with a microprocessor of the computer to remove heat from the microprocessor,
   attaching a shroud to the vertical plates of the heat sink, wherein the shroud is contoured to accommodate the vertical plates of the heat sink,
   enclosing the heat sin with the shroud, and
   directing air through the heat sink to remove heat from the heat sink.

10. The method of claim 9 wherein the step of attaching comprises the step of quick-detachably connecting the shroud to the heat sink.

11. The method of claim 9 wherein a tab is provided on the shroud and wherein the step of attaching comprising the steps of pulling the tab so that it flexes, placing the shroud over the heat sink and releasing the tab so that the tab engages the vertical plates of the heat sink.

12. The method of claim 9 further comprising the step of directing the air across the microprocessor.

13. In a computer comprising a chassis, a microprocessor module disposed in the chassis, a heat sink having structurally integrated vertical and horizontal plates and disposed in the chassis in a heat exchange relation to the microprocessor, and a fan for inducing air flow in the chassis; the improvement comprising:

a shroud connected to the heat sink and enclosing the heat sink for directing the air through the heat sink for removing heat from the heat sink, wherein the shroud is contoured to accommodate the vertical plates of the heat sink.

14. The improvement of claim 13 wherein the shroud is quick-detachably connected to the heat sink.

15. The improvement of claim 13 wherein the shroud comprises an enclosure and at least one tab formed on the enclosure for engaging the vertical plates of the heat sink to connect the shroud to the heat sink.

16. The improvement of claim 15 wherein the shroud further comprises a hook extending from the tab and adapted to engage the vertical plates of the heat sink to connect the shroud to the heat sink.

17. The improvement of claim 15 wherein the tab is resiliently coupled to the enclosure to enable the tab to be engaged with, and removed from, the vertical plates of the heat sink.

18. The improvement of claim 16 wherein the shroud further comprises a lip extending from the tab to enable the tab to be manually flexed relative to the enclosure, thus disengaging the hook from the plates.

19. The improvement of claim 13 wherein the shroud includes a member for directing air across the microprocessor.

20. A shroud for use in a computer having a cooling fan and one or more heat sinks the heat sink having vertical plates arranged in a predetermined shape for heat exchange, comprising:

a first portion for coupling to the fan, a second portion coupled to the first portion for enclosing and coupling to the heat sinks, the second portion having a surface contoured to accommodate the vertical plates of the heat sinks, and one or more tabs resiliently coupled to the surface of the second portion, each tab including a lip extending from the surface of the second portion in a first direction and a hook extending from the surface of the second portion in a direction substantially opposite the first direction for engaging the vertical plates of the heat sink.

21. The shroud of claim 20, wherein the tabs further include:

a cantilever support coupled to the second portion of the shroud for resiliently supporting the lip and hook.

* * * * *